(12) United States Patent
Obinata (10) Patent No.: US 7,138,878 B2
(45) Date of Patent: Nov. 21, 2006

(54) SEMICONDUCTOR INTEGRATED CIRCUIT

(75) Inventor: Atsushi Obinata, Hachioji (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/892,549

(22) Filed: Jul. 15, 2004

(65) Prior Publication Data
US 2005/0066214 A1    Mar. 24, 2005

(30) Foreign Application Priority Data
Jul. 16, 2003    (JP) ............................. 2003-198137

(51) Int. Cl.
*H03L 7/00*    (2006.01)
(52) U.S. Cl. .............. 331/2; 331/74; 714/37; 714/724; 703/18; 716/4
(58) Field of Classification Search ............ 331/2, 331/74; 714/37, 724; 703/18; 716/4
See application file for complete search history.

(56) References Cited

U.S. PATENT DOCUMENTS

| | | | | |
|---|---|---|---|---|
| 4,924,468 A | * | 5/1990 | Horak et al. | 714/724 |
| 6,000,036 A | | 12/1999 | Durham et al. | 713/300 |
| 6,219,798 B1 | | 4/2001 | Choi | |
| 6,785,826 B1 | | 8/2004 | Durham et al. | 713/300 |
| 6,834,360 B1 | * | 12/2004 | Corti et al. | 714/37 |

FOREIGN PATENT DOCUMENTS

| | | |
|---|---|---|
| JP | 10-69330 | 3/1998 |
| JP | 10-91298 | 4/1998 |
| JP | 11-83950 | 3/1999 |
| JP | 2000-049593 | 2/2000 |
| JP | 2000-148284 | 5/2000 |

OTHER PUBLICATIONS

Examination result issued in corresponding Japanese application.

* cited by examiner

*Primary Examiner*—Arnold Kinkead
(74) *Attorney, Agent, or Firm*—Harness, Dickey & Pierce, P.L.C.

(57) ABSTRACT

A semiconductor integrated circuit is provided in which power consumption of each functional block can be determined. The semiconductor integrated circuit comprises: first through third signal processing circuits each operating in synchronization with first through third externally supplied clock signals; first through third counters each counting first through third clock signals; a bus interface circuit outputting a plurality of count values that the first through third counters counted; a clock enable signal generating circuit to generate first through third clock enable signals each controlling the supply of the first through third clock signals to the first through third signal processing circuits; and a counter control circuit supplying a plurality of counter reset signals and a plurality of counter enable signals for resetting and operating the first through third counters, respectively.

3 Claims, 10 Drawing Sheets

SEMICONDUCTOR INTEGRATED CIRCUIT

RELATED APPLICATIONS

This application claims priority to Japanese Patent Application No. 2003-198137 filed Jul. 16, 2003 which is hereby expressly incorporated by reference herein in its entirety.

BACKGROUND

1. Field of the Invention

The present invention relates to a semiconductor integrated circuit comprising a plurality of functional blocks such as signal processing circuits. In particular, power consumption of each functional block can be realized.

2. Related Art

A conventional method of measuring power consumption of a semiconductor integrated circuit is explained below.

First, a semiconductor integrated circuit is mounted onto a circuit board. Next an ammeter is connected to power supply wiring prepared on the circuit board. Then, the circuit board and the semiconductor integrated circuit are operated. The ammeter measures the current passing through the power supply wiring prepared on the circuit board, and a measured current value is used for calculating the power consumption of the semiconductor integrated circuit.

If it is impossible to connect the ammeter to the circuit board (because of any reason, for example, the circuit board is built in a cabinet, and so on), applying the conventional measuring method as described above cannot measure the power consumption of the semiconductor integrated circuit.

Moreover, in case a plurality of semiconductor integrated circuits together with registers and so on are connected to a single set of power supply wirings prepared on a circuit board, applying the conventional measuring method as described above does not make it possible to realize power consumption of each device.

Furthermore, a semiconductor integrated circuit comprising a plurality of functional blocks that each operate in synchronization with a plurality of different clock signals has recently come into use. However, applying the conventional measuring method as described above does not make it possible to realize power consumption of each of the functional blocks inside the semiconductor integrated circuit.

Incidentally, a type of counter device, which has its counter operate to reduce power consumption only when needed, is known. (For example; refer to Japanese Patent Laid-Open Publication No. 2000-49593 (first page and FIG. 1)).

However, such a counter device described in Japanese Patent Laid-Open Publication No. 2000-49593 does not make it possible to measure power consumption of each of a plurality of functional blocks placed internally.

Furthermore, a type of semiconductor integrated circuit device and equivalent, in which a determination on supplying a clock signal is made for each module, is also known. (For example; refer to Japanese Patent Laid-Open Publication No. 2000-148284 (first page and FIG. 1)).

However, such a semiconductor integrated circuit device and equivalent described in Japanese Patent Laid-Open Publication No.2000-148284 do not make it possible to measure power consumption of each of a plurality of signal processing circuits placed internally.

Taking the points described above into consideration, the present invention aims to provide a semiconductor integrated circuit which comprises a plurality of functional blocks such as signal processing circuits and so on, and in which the power consumption of each functional block can be determined.

SUMMARY

To solve the problems described above, a semiconductor integrated circuit according to a first aspect of the present invention comprises: a plurality of functional blocks to materialize each specified function, wherein the plurality of functional blocks each operate according to a plurality of clock signals; a plurality of counter circuits to each count the plurality of clock signals; and an interface circuit to externally output a plurality of count values that the plurality of counter circuits have each counted.

The semiconductor integrated circuit may furthermore comprise a control circuit that generates a plurality of control signals, that each control supplying the plurality of clock signals to the plurality of functional blocks.

A semiconductor integrated circuit according to a second aspect of the present invention comprises: a plurality of functional blocks to materialize each specified function, wherein the plurality of functional blocks each operate according to a plurality of clock signals; a control circuit that generates a plurality of control signals, which each control the supply of the plurality of clock signals to the plurality of functional blocks; a plurality of counter circuits to count another clock signal while the plurality of control signals are each in active status; and an interface circuit to externally output a plurality of count values that the plurality of counter circuits have each counted.

The semiconductor integrated circuit may furthermore comprise a second control circuit that supplies a second group of control signals to each of the plurality of counter circuits for controlling the operation of the plurality of counter circuits.

A semiconductor integrated circuit according to a third aspect of the present invention comprises: a plurality of functional blocks to materialize each specified function, wherein the plurality of functional blocks each operate according to a plurality of clock signals; a first control circuit that generates a first group of control signals, which each control the supply of the plurality of clock signals to the plurality of functional blocks; a plurality of counter circuits to count another clock signal while the first group of control signals are each in active status; an interface circuit to externally output a plurality of count values that the plurality of counter circuits have each counted; and a second control circuit that supplies a second group of control signals to each of the plurality of counter circuits for a specified time for operating the plurality of counter circuits, and generates an interrupt signal for commanding an external CPU to read the plurality of count values after the specified time elapses.

A semiconductor integrated circuit according to a fourth aspect of the present invention comprises: a plurality of functional blocks to materialize each specified function, wherein the plurality of functional blocks each operate according to a plurality of clock signals; a first control circuit that generates a plurality of control signals, which each control the supply of the plurality of clock signals to the plurality of functional blocks; a plurality of counter circuits to count another clock signal while the plurality of control signals are each in active status; a second control circuit that supplies the foregoing other clock signal to the plurality of counter circuits according to another externally supplied control signal; and an interface circuit to externally output a plurality of count values that the plurality of counter circuits have each counted.

In the semiconductor integrated circuit, a frequency of the foregoing other clock signal may be lower than that of the plurality of clock signals.

The semiconductor integrated circuit may furthermore comprise: a conversion circuit to convert the plurality of count values counted by the counter circuits into a serial signal and output it; and a terminal to externally output the serial signal output by the conversion circuit.

According to the structure described above, power consumption of each functional block can be determined.

DETAILED DESCRIPTION

The following sections describe embodiments of the present invention while referring to the drawings. Incidentally, certain parts of the same structural elements are indicated with the same reference number throughout the drawings.

Figure 1:
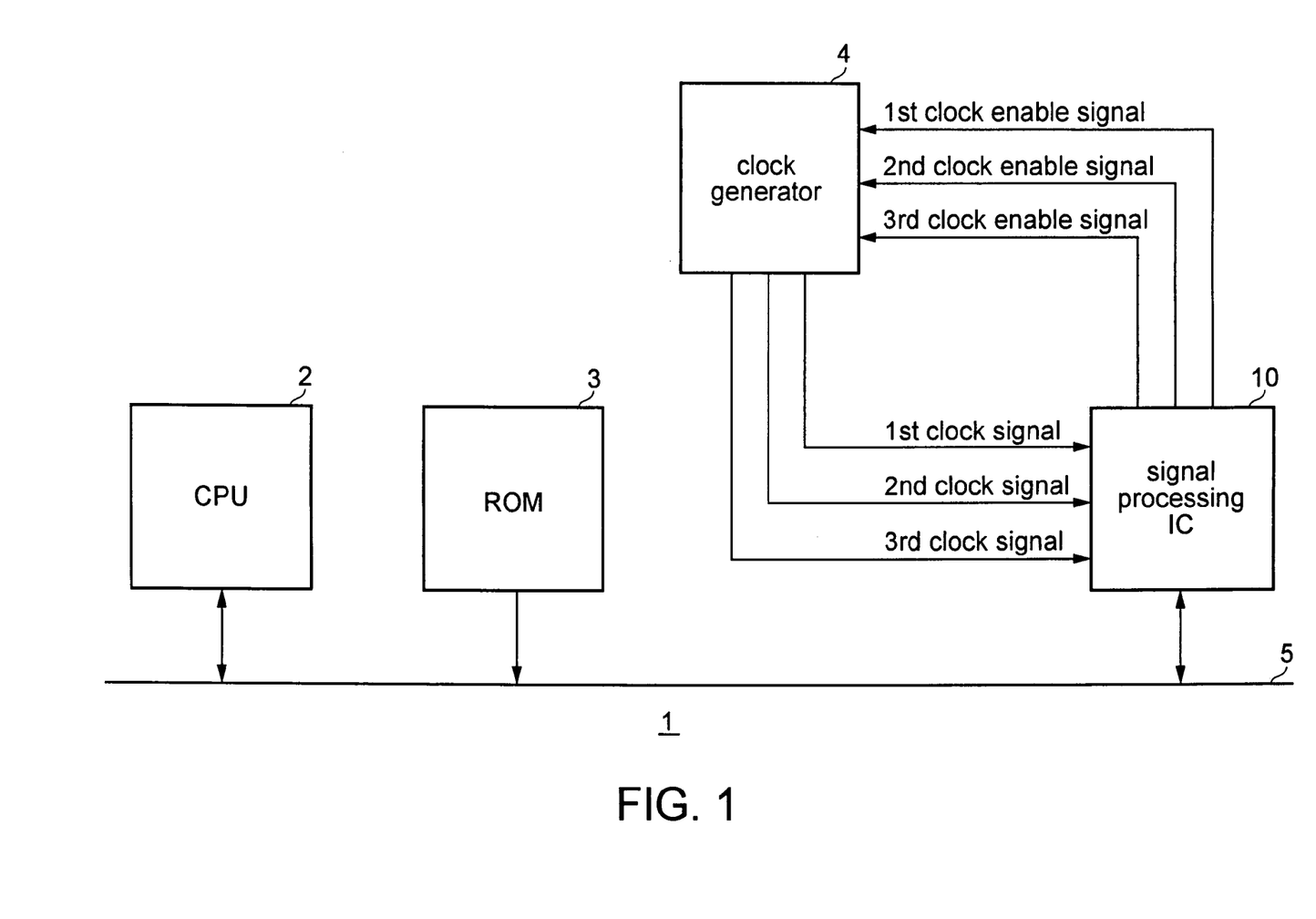
FIG. 1 shows a system according to a first embodiment of the present invention.

FIG. 1 shows a general outline of a system using a signal processing IC (Integrated Circuit) according to a first embodiment of the present invention. As shown in FIG. 1, a system 1 comprises: a CPU (Central Processing Unit) 2, a ROM (Read Only Memory) 3, a clock generator 4, and a signal processing IC 10 according to the first embodiment of the present invention. The CPU 2, the ROM 3, and the signal processing IC 10 are connected through a bus 5.

According to a first clock enable signal through a third clock enable signal supplied from the signal processing IC 10, the clock generator 4 supplies a first clock signal through a third clock signal to the signal processing IC 10. The signal processing IC 10 operates in synchronization with the first through third clock signals supplied from the clock generator 4.

Figure 2:
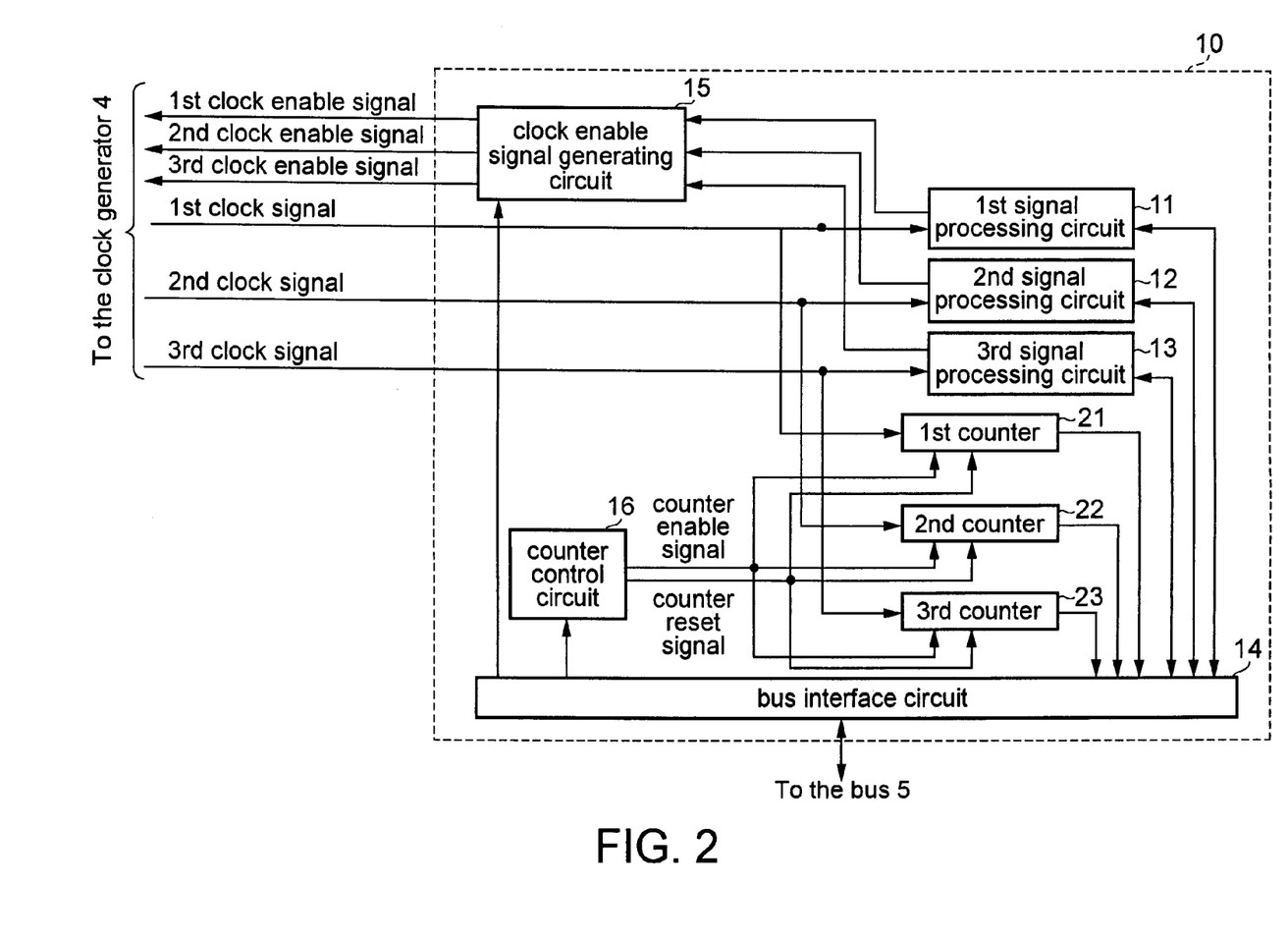
FIG. 2 shows a structure of a signal processing IC according to the first embodiment of the present invention.

FIG. 2 shows a general outline of an internal structure of the signal processing IC 10. As shown in FIG. 2, the signal processing IC 10 comprises: a first signal processing circuit 11 through a third signal processing circuit 13 (functional blocks), a bus interface circuit 14, a clock enable signal generating circuit 15, a counter control circuit 16, and a first counter 21 through a third counter 23.

The bus interface circuit 14 sends and receives signals between: the first through third signal processing circuits 11 through 13, the clock enable signal generating circuit 15, the counter control circuit 16, and the first through third counters 21 through 23; and the bus 5.

The clock enable signal generating circuit 15 either supplies a plurality of CLK control signals, each generated by the first through third signal processing circuits 11 through 13, as the first through third clock enable signals to the clock generator 4 (refer to FIG. 1), as they are; or receives a control signal supplied by the CPU 2 (refer to FIG. 1) via the bus 5 and the bus interface circuit 14, and generates a plurality of first through third clock enable signals according to the control signal, and then supplies them to the clock generator 4 (refer to FIG. 1).

The first through third signal processing circuits 11 through 13 operate in synchronization with the first through third clock signals supplied by the clock generator 4 (refer to FIG. 1) to implement signal processing operation.

The counter control circuit 16 receives a control signal supplied by the CPU 2 (refer to FIG. 1) via the bus 5 and the bus interface circuit 14, and supplies a plurality of counter enable signals and counter reset signals to the first through third counters 21 through 23 according to the control signal.

The first through third counters 21 through 23 each count the first through third clock signals, while the counter enable signals are in active status. On the other hand, the first through third counters 21 through 23 reset their count values when the counter reset signals become active.

Power consumption $W_1$ of the first signal processing circuit 11, while the first clock signal being supplied, is calculated by the following formula;

Formula 1

$$W_1 \approx K_1 \times \frac{\text{(Count value of the 1st counter)}}{\text{(Measuring time)}} \quad (1)$$

where $K_1$ is a constant calculated by the following formula.

Formula 2

$$K_1 = \text{(No. of gates in the 1st signal processing circuit 11)} \times \quad (2)$$
$$\text{(Power supply voltage applied to}$$
$$\text{the 1st signal processing circuit 11)} \times$$
$$\text{(Average operation rate of the 1st signal processing circuit 11)} \times$$
$$\text{(Correction factor)}$$

In addition, the average operation rate of the first signal processing circuit 11 is a time average percentage of the operating gates in comparison with all the gates in the first signal processing circuit 11, and this rate value can be calculated by power simulation after completion of circuit designing of the first signal processing circuit 11.

In the same manner, power consumption $W_2$ of the second signal processing circuit 12 is also calculated by the following formula;

Formula 3

$$W_2 \approx K_2 \times \frac{\text{(Count value of the 2nd counter)}}{\text{(Measuring time)}} \quad (3)$$

where $K_2$ is a constant calculated by the following formula.

Formula 4

$$\begin{aligned}K_2 = &\text{(No. of gates in the 2nd signal processing circuit 12)} \times \\ &\text{(Power supply voltage applied to} \\ &\text{the 2nd signal processing circut 12)} \times \\ &\text{(Average operation rate of the 2nd signal processing circuit 12)} \times \\ &\text{(Correction factor)}\end{aligned} \quad (4)$$

Furthermore, power consumption $W_3$ of the third signal processing circuit 13 is also calculated by the following formula;

Formula 5

$$W_3 \approx K_3 \times \frac{\text{(Count value of the 3rd counter)}}{\text{(Measuring time)}} \quad (5)$$

where $K_3$ is a constant calculated by the following formula.

Formula 6

$$\begin{aligned}K_3 = &\text{(No. of gates in the 3rd signal processing circuit 13)} \times \\ &\text{(Power supply voltage applied to the 3rd signal processing} \\ &\text{circuit 13)} \times \text{(Average operation rate of the 3rd} \\ &\text{signal processing circuit 13)} \times \text{(Correction factor)}\end{aligned} \quad (6)$$

A total power consumption $W_{all}$ of the signal processing IC 10 is calculated as described below;

Formula 7

$$W_{all} \approx W_1 + W_2 + W_3 + W_e \quad (7)$$

where the value $W_e$ is a correction value on power consumption, which includes power consumption of an asynchronous part inside the signal processing IC 10, static power consumption, and so on.

To describe further by referring to FIG. 1 again, the constants $K_1$ through $K_3$ are stored in the ROM 3, and then the CPU 2 can read the count values of the first through third counters 21 through 23 (refer to FIG. 2) out of the signal processing IC 10, and also read the constants $K_1$ through $K_3$ out of the ROM 3, as required, so that the CPU 2 can calculate each power consumption of the first through third signal processing circuits 11 through 13 (refer to FIG. 2) by using the formulas of (1), (3) and (5).

As described above, since the CPU 2 can calculate each power consumption of the first through third signal processing circuits 11 through 13 (refer to FIG. 2) in real-time, eventually it becomes possible to elaborately implement power management.

When the total power consumption of the signal processing IC 10 it is needed to be known, the CPU 2 reads the value of $W_e$ saved in the ROM 3 and carries out calculation by using the above formula (7) to obtain the total power consumption value.

In the present embodiment, the signal processing IC 10 comprises the clock enable signal generating circuit 15 and the counter control circuit 16. However, it is also possible to externally have the clock enable signal generating circuit 15 and the counter control circuit 16 outside the signal processing IC 10.

Furthermore, the clock generator 4 may be formed inside the signal processing IC 10.

Figure 3:
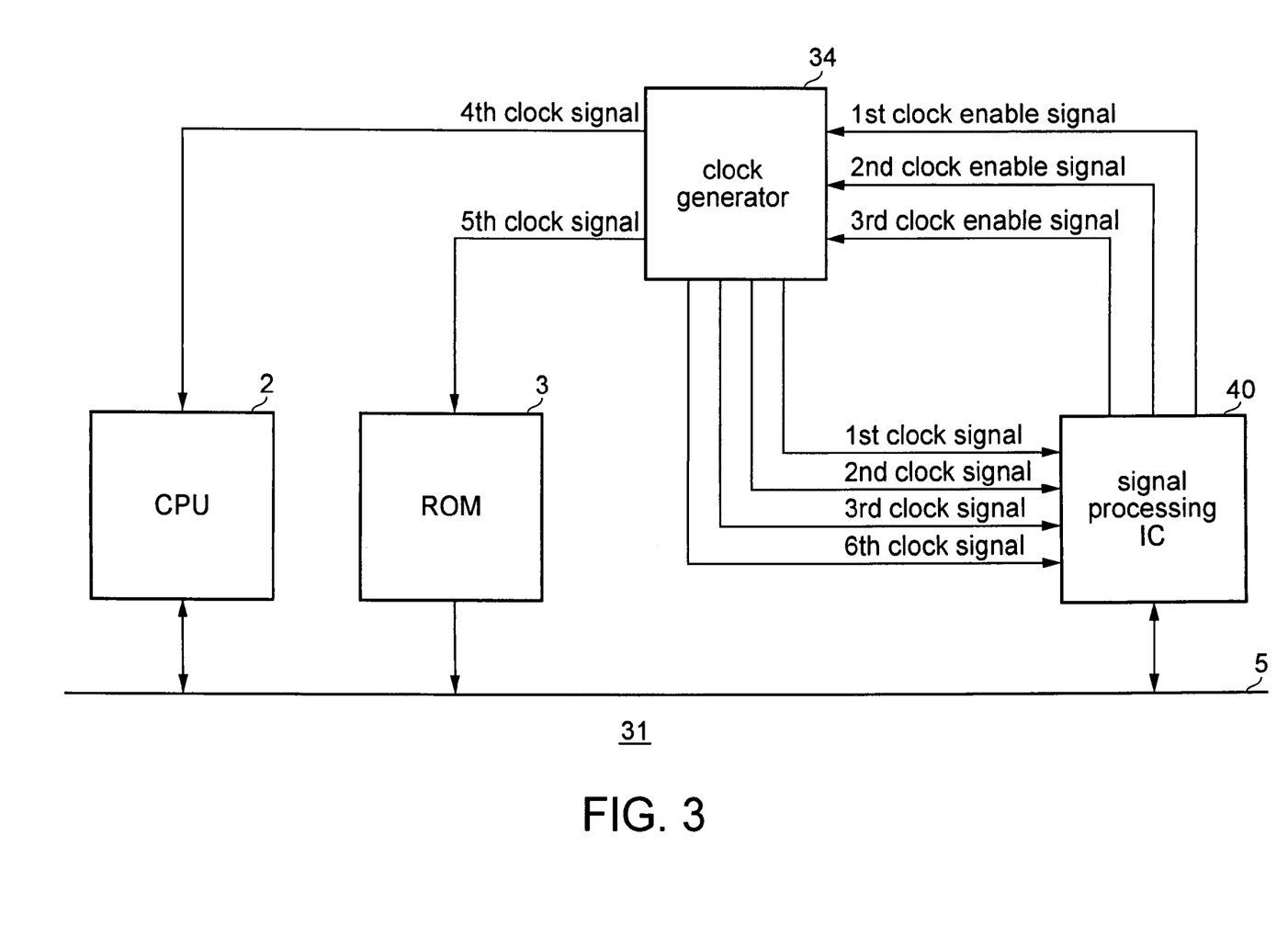
FIG. 3 shows a system according to a second embodiment of the present invention.

A second embodiment of the present invention is next described below. FIG. 3 schematically shows a system using a signal processing IC according to a second embodiment of the present invention. As shown in FIG. 3, a system 31 comprises: the CPU 2, the ROM 3, a clock generator 34, and a signal processing IC 40 according to the second embodiment of the present invention. The CPU 2, the ROM 3, and the signal processing IC 40 are connected through the bus 5.

According to a first clock enable signal through a third clock enable signal supplied from the signal processing IC 40, the clock generator 34 supplies a first clock signal through a third clock signal to the signal processing IC 40. Furthermore, the clock generator 34 also supplies a sixth clock signal, having a frequency lower than those of the first through third clock signals, to the signal processing IC 40. Also, the clock generator 34 supplies a fourth clock signal and a fifth clock signal to the CPU 2 and the ROM 3, respectively. The CPU 2, the ROM 3, and the signal processing IC 40 each operate in synchronization with the first through sixth clock signals supplied from the clock generator 34.

Figure 4:
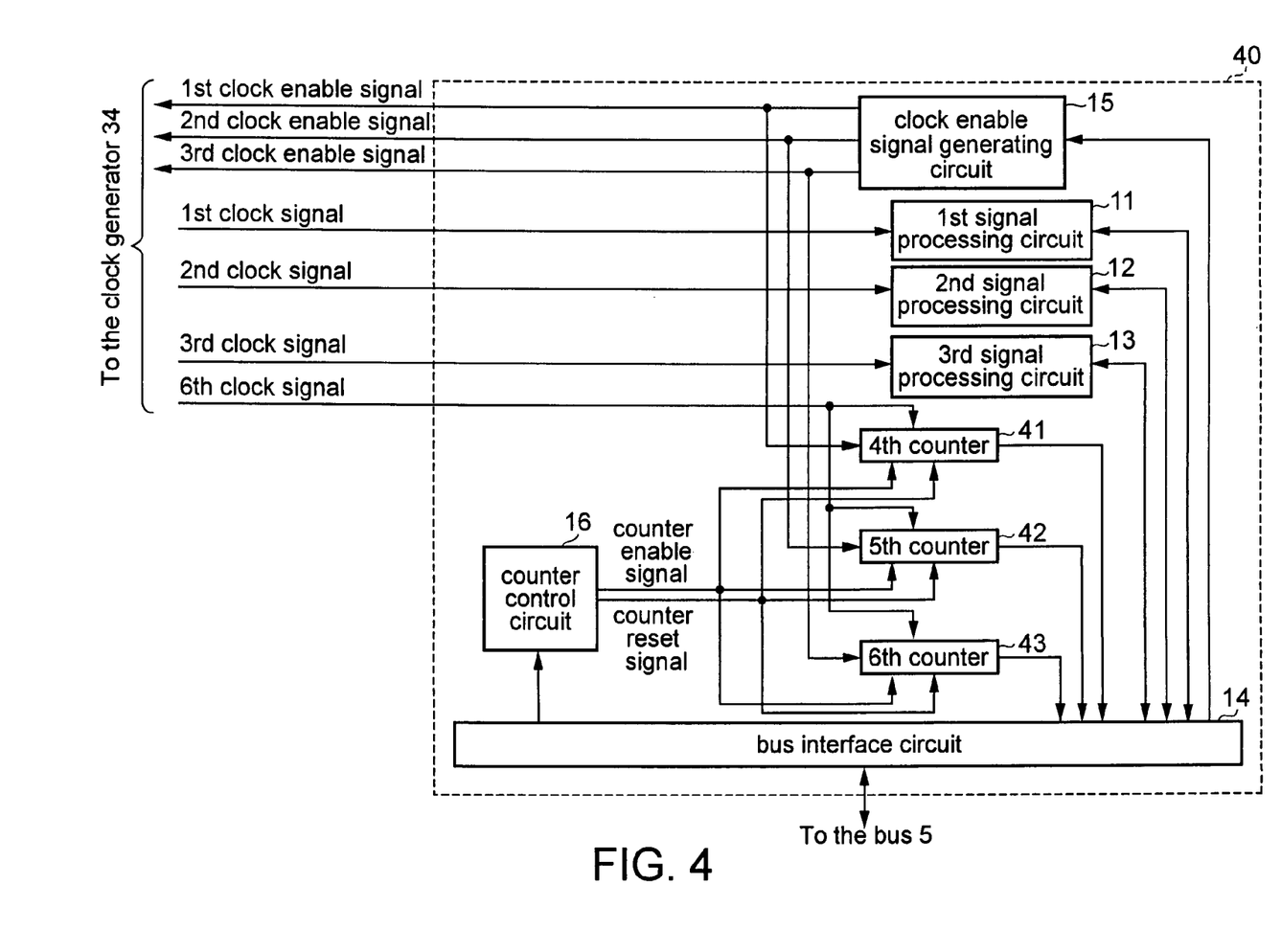
FIG. 4 shows a structure of a signal processing IC according to the second embodiment of the present invention.

FIG. 4 shows a general outline of an internal structure of the signal processing IC 40. As shown in FIG. 4, the signal processing IC 40 comprises: the first through third signal processing circuits 11 through 13 (functional blocks), the bus interface circuit 14, the clock enable signal generating circuit 15, the counter control circuit 16, and a fourth counter 41 through a sixth counter 43.

The fourth through sixth counters 41 through 43 each count the sixth clock signal, while a first counter enable signal through a third counter enable signal are in active status. On the other hand, the fourth through sixth counters 41 through 43 reset their count values when the counter reset signals become active.

Power consumption $W_1$ of the first signal processing circuit 11, while the first clock signal being supplied, is calculated by the following formula;

Formula 8

$$W_1 \approx K_4 \times \frac{\text{(Count value of the 4th counter)}}{\text{(Measuring time)}} \quad (8)$$

where $K_4$ is a constant calculated by the following formula.

Formula 9

$$K_4 = (\text{No. of gates in the 1st signal processing circuit 11}) \times \quad (9)$$
$$(\text{Power supply voltage applied to}$$
$$\text{the 1st signal processing circuit 11}) \times$$
$$(\text{Average operation rate of the 1st signal processing circuit 11}) \times$$
$$(\text{Frequency of the 1st clock signal}) \times (\text{Correction factor})$$

In the same manner, power consumption $W_2$ of the second signal processing circuit 12 is also calculated by the following formula;

Formula 10

$$W_2 \approx K_5 \times \frac{(\text{Count value of the 5th counter})}{(\text{Measuring time})} \quad (10)$$

where $K_5$ is a constant calculated by the following formula.

Formula 11

$$K_5 = (\text{No. of gates in the 2nd signal processing circuit 12}) \times \quad (11)$$
$$(\text{Power supply voltage applied to the 2nd signal}$$
$$\text{processing circuit 12}) \times (\text{Average operation}$$
$$\text{rate of the 2nd signal processing circuit 12}) \times$$
$$(\text{Frequency of the 2nd clock signal}) \times (\text{Correction factor})$$

Furthermore, power consumption $W_3$ of the third signal processing circuit 13 is also calculated by the following formula;

Formula 12

$$W_3 \approx K_6 \times \frac{(\text{Count value of the 6th counter})}{(\text{Measuring time})} \quad (12)$$

where $K_6$ is a constant calculated by the following formula.

Formula 13

$$K_6 = (\text{No. of gates in the 3rd signal processing circuit 13}) \times \quad (13)$$
$$(\text{Power supply voltage applied to the 3rd signal}$$
$$\text{processing circuit 13}) \times (\text{Average operation}$$
$$\text{rate of the 3rd signal processing circuit 13}) \times$$
$$(\text{Frequency of the 3rd clock signal}) \times (\text{Correction factor})$$

To describe further by referring to FIG. 3 again, the constants $K_4$ through $K_6$ are stored in the ROM 3, and then the CPU 2 can read the count values of the fourth through sixth counters 41 through 43 (refer to FIG. 4) out of the signal processing IC 40, and also read the constants $K_4$ through $K_6$ out of the ROM 3, as required, so that the CPU 2 can calculate each power consumption of the first through third signal processing circuits 11 through 13 (refer to FIG. 4) by using the formulas of (7), (9) and (11).

At this point, a comparison is made between the signal processing IC 10 (refer to FIG. 2) already described and the signal processing IC 40 (refer to FIG. 4). The first through third counters 21 through 23 (refer to FIG. 2) inside the signal processing IC 10 operates in synchronization with the first through third clock signals. Meanwhile, the fourth through sixth counters 41 through 43 inside the signal processing IC 40 each count the sixth clock signal, having a frequency lower than those of the first through third clock signals, while the first through third clock enable signals are in active status. Therefore, the signal processing IC 40 can materialize the same function as the signal processing IC 10 does, even with less power consumption than that of the signal processing IC 10.

In the present embodiment, the signal processing IC 40 comprises the counter control circuit 16. However, it is also possible to have an external counter control circuit 16 outside the signal processing IC 40.

Figure 5:
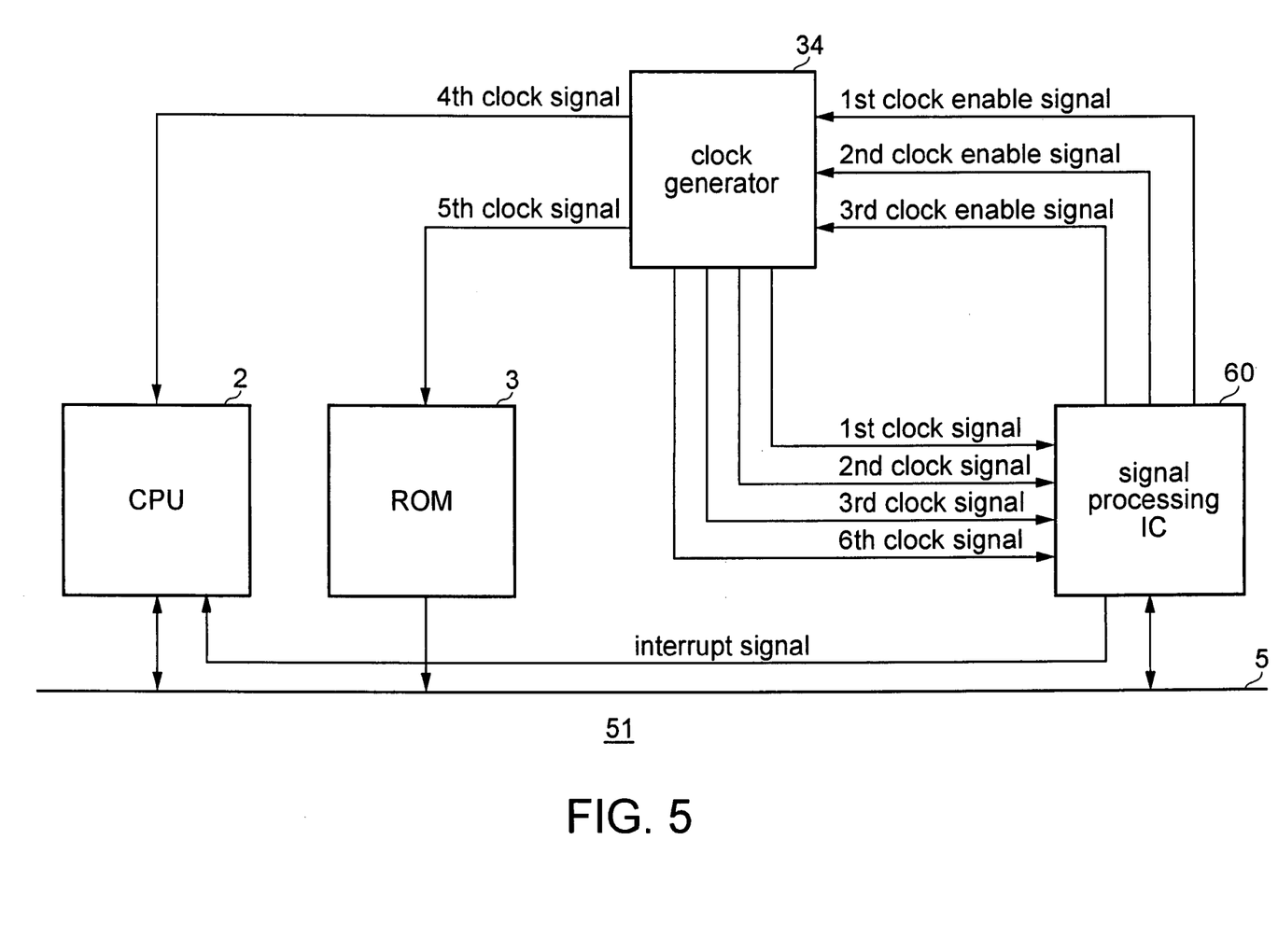
FIG. 5 shows a system according to a third embodiment of the present invention.

A third embodiment of the present invention is next described below. FIG. 5 schematically shows a system using a signal processing IC according to a third embodiment of the present invention. As shown in FIG. 5, a system 51 comprises: the CPU 2, the ROM 3, the clock generator 34, and a signal processing IC 60 according to the third embodiment of the present invention. The CPU 2, the ROM 3, and the signal processing IC 60 are connected through the bus 5.

Figure 6:
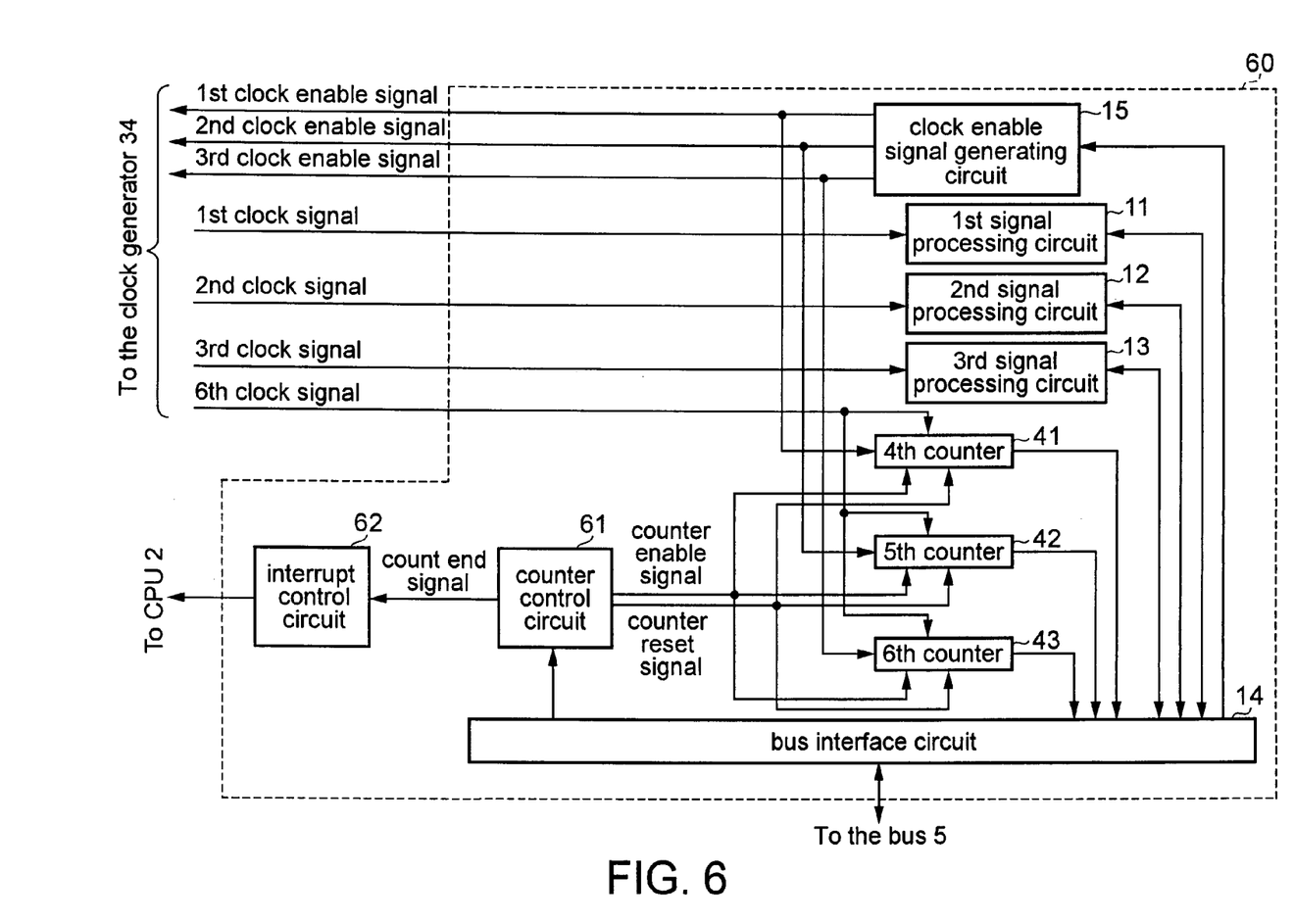
FIG. 6 shows a structure of a signal processing IC according to the third embodiment of the present invention.

FIG. 6 shows a general outline of an internal structure of the signal processing IC 60. As shown in FIG. 6, the signal processing IC 60 comprises: the first through third signal processing circuits 11 through 13 (functional blocks), the bus interface circuit 14, the clock enable signal generating circuit 15, the fourth through sixth counters 41 through 43, a counter control circuit 61, and an interrupt control circuit 62.

The counter control circuit 61 receives a control signal supplied by the CPU 2 (refer to FIG. 5) via the bus 5 and the bus interface circuit 14, and supplies a plurality of counter enable signals and counter reset signals to the fourth through sixth counters 41 through 43 according to the control signal. In a specified time after receiving the control signal supplied by the CPU 2 (refer to FIG. 3), the counter control circuit 61 finishes supplying the counter enable signals, and supplies a count end signal to the interrupt control circuit 62. Incidentally, the counter control circuit 61 is able to control passage of the specified time by using a down counter, etc.

When receiving the count end signal from the counter control circuit 61, the interrupt control circuit 62 supplies an interrupt signal to the CPU 2 (refer to FIG. 5). When receiving the interrupt signal from the interrupt control circuit 62, the CPU 2 can read the count values of the fourth through sixth counters 41 through 43 (refer to FIG. 4) out of the signal processing IC 40, and also read the constants $K_4$ through $K_6$ out of the ROM 3, so that the CPU 2 can calculate each power consumption of the first through third signal processing circuits 11 through 13 (refer to FIG. 6) by using the formulas of (7), (9) and (11).

At this point, a comparison is made between the signal processing IC 40 (refer to FIG. 4) already described and the signal processing IC 60 (refer to FIG. 6). In the system 31 (refer to FIG. 3) using the signal processing IC 40, the CPU 2 needs to read the count values of the fourth through sixth counters 41 through 43 (refer to FIG. 4), as required (for example, at specified time intervals, etc.) and calculate power consumption of the first through third signal processing circuits 11 through 13. Meanwhile, in the system 51 (refer to FIG. 5) using the signal processing IC 60, it is required that the CPU 2 reads the count values of the fourth through sixth counters 41 through 43 (refer to FIG. 6) only when the CPU 2 receives the interrupt signal from the interrupt control circuit 62. As a result of it, a workload for the CPU can be lightened.

Figure 7:
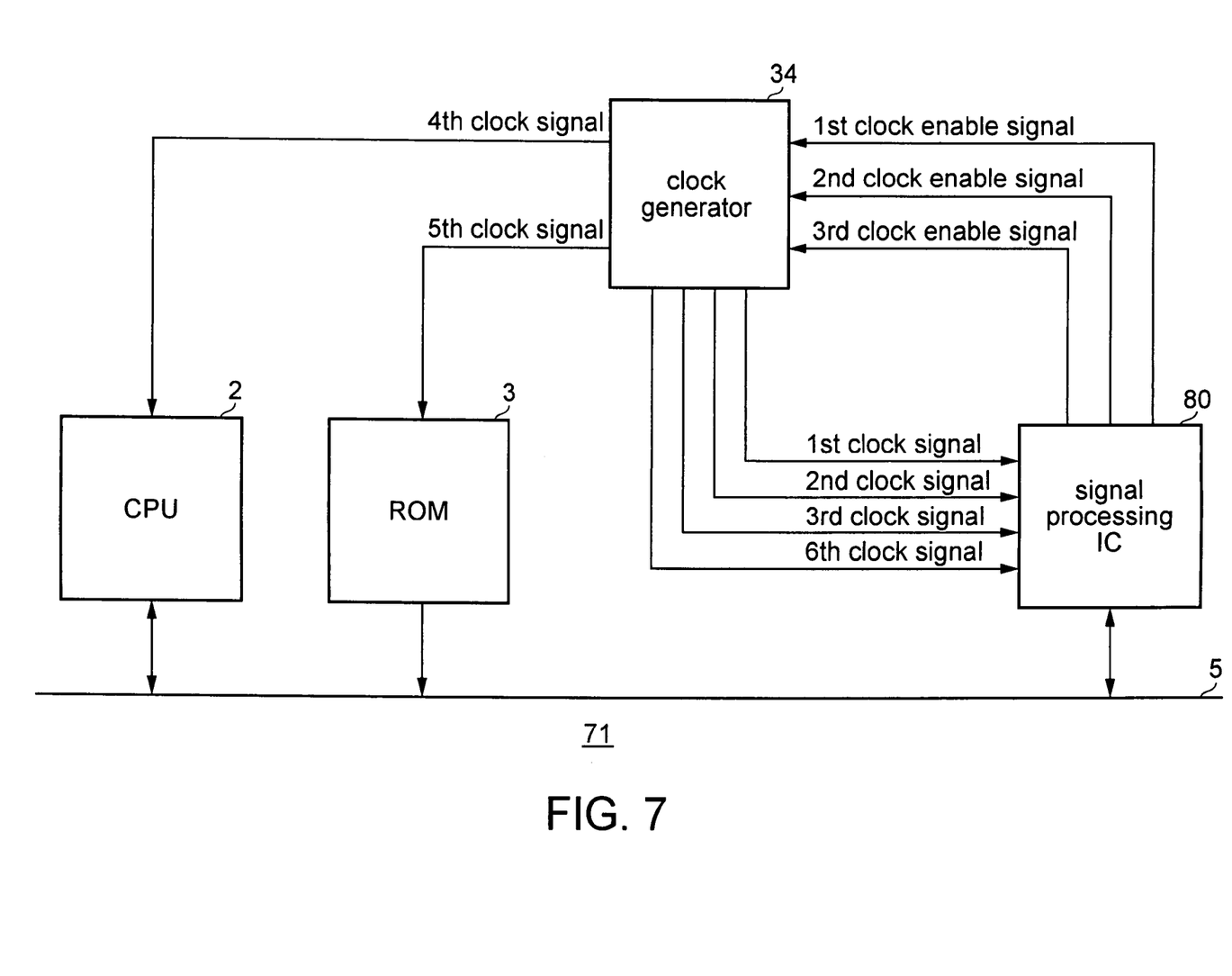
FIG. 7 shows a system according to a fourth embodiment of the present invention.

A fourth embodiment of the present invention is next described below. FIG. 7 schematically shows a system using a signal processing IC according to a fourth embodiment of the present invention. As shown in FIG. 7, a system 71 comprises: the CPU 2, the ROM 3, the clock generator 34, and a signal processing IC 80 according to the fourth embodiment of the present invention. The CPU 2, the ROM 3, and the signal processing IC 80 are connected through the bus 5.

Figure 8:
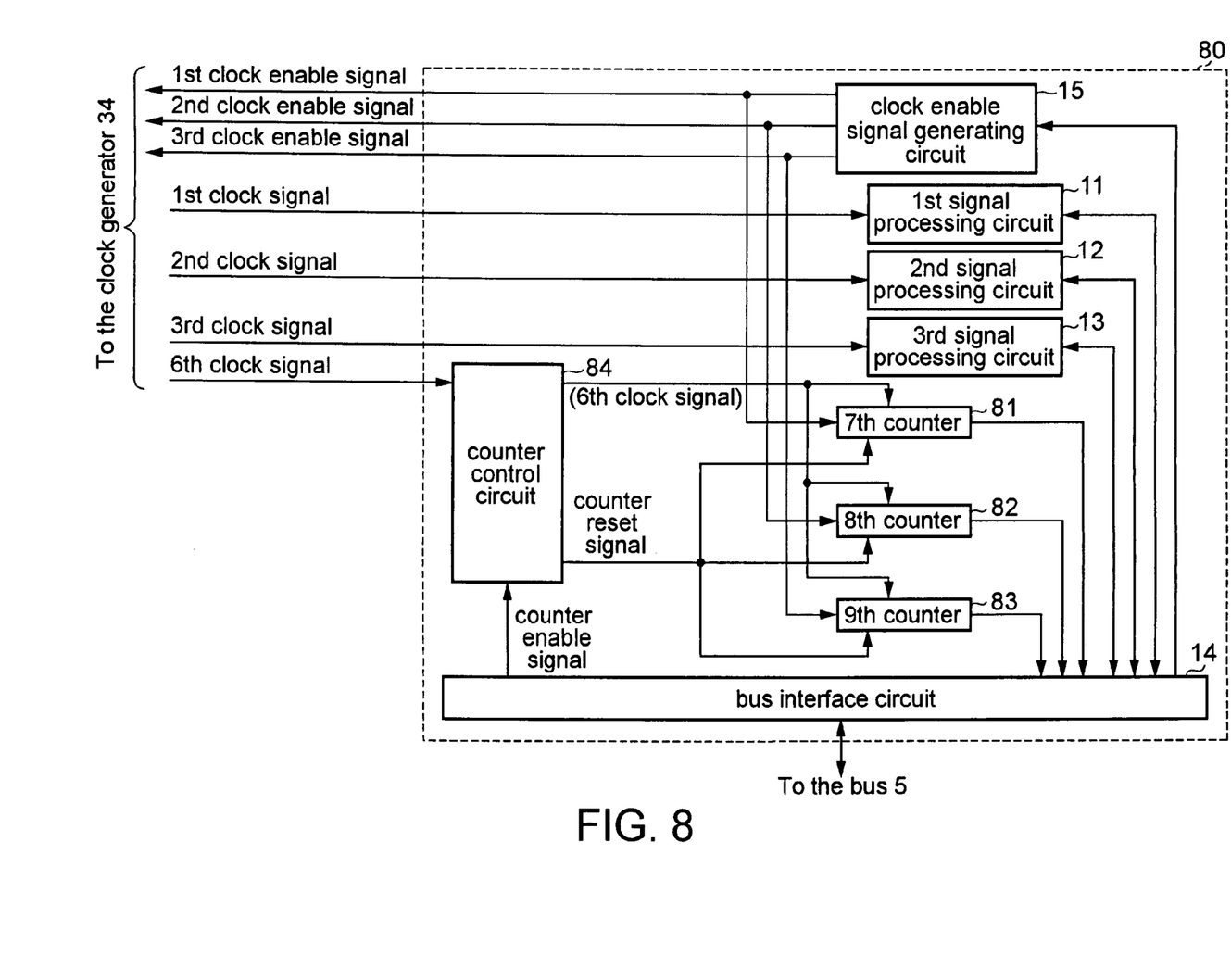
FIG. 8 shows a structure of a signal processing IC according to the fourth embodiment of the present invention.

FIG. 8 shows a general outline of an internal structure of the signal processing IC 80. As shown in FIG. 8, the signal processing IC 80 comprises: the first through third signal processing circuits 11 through 13 (functional blocks), the bus interface circuit 14, the clock enable signal generating circuit 15, a seventh counter 81 through a ninth counter 83, and a counter control circuit 84.

While being supplied with a counter enable signal from the CPU 2 (refer to FIG. 7); the counter control circuit 84 supplies the sixth clock signal, being supplied from the clock generator 34 (refer to FIG. 7), to the seventh through ninth counters 81 through 83. On the other hand, while not being supplied with a counter enable signal from the CPU 2 (refer to FIG. 7); the counter control circuit 84 does not supply the sixth clock signal, being supplied from the clock generator 34 (refer to FIG. 7), to the seventh through ninth counters 81 through 83.

The seventh through ninth counters 81 through 83 count the sixth clock signal supplied from the counter control circuit 84, while the first through third clock enable signals are in active status.

To describe further by referring to FIG. 7 again, the CPU 2 can read the count values of the seventh through ninth counters 81 through 83 (refer to FIG. 8) out of the signal processing IC 80, and also read the constants $K_4$ through $K_6$ out of the ROM 3, as required, so that the CPU 2 can calculate each power consumption of the first through third signal processing circuits 11 through 13 (refer to FIG. 8) by using the formulas of (7), (9) and (11).

In the signal processing IC 80, the seventh through ninth counters 81 through 83 get into operation only while the CPU 2 is supplying the counter enable signal to the counter control circuit 84 (refer to FIG. 8). Therefore, power consumption can be reduced.

Figure 9:
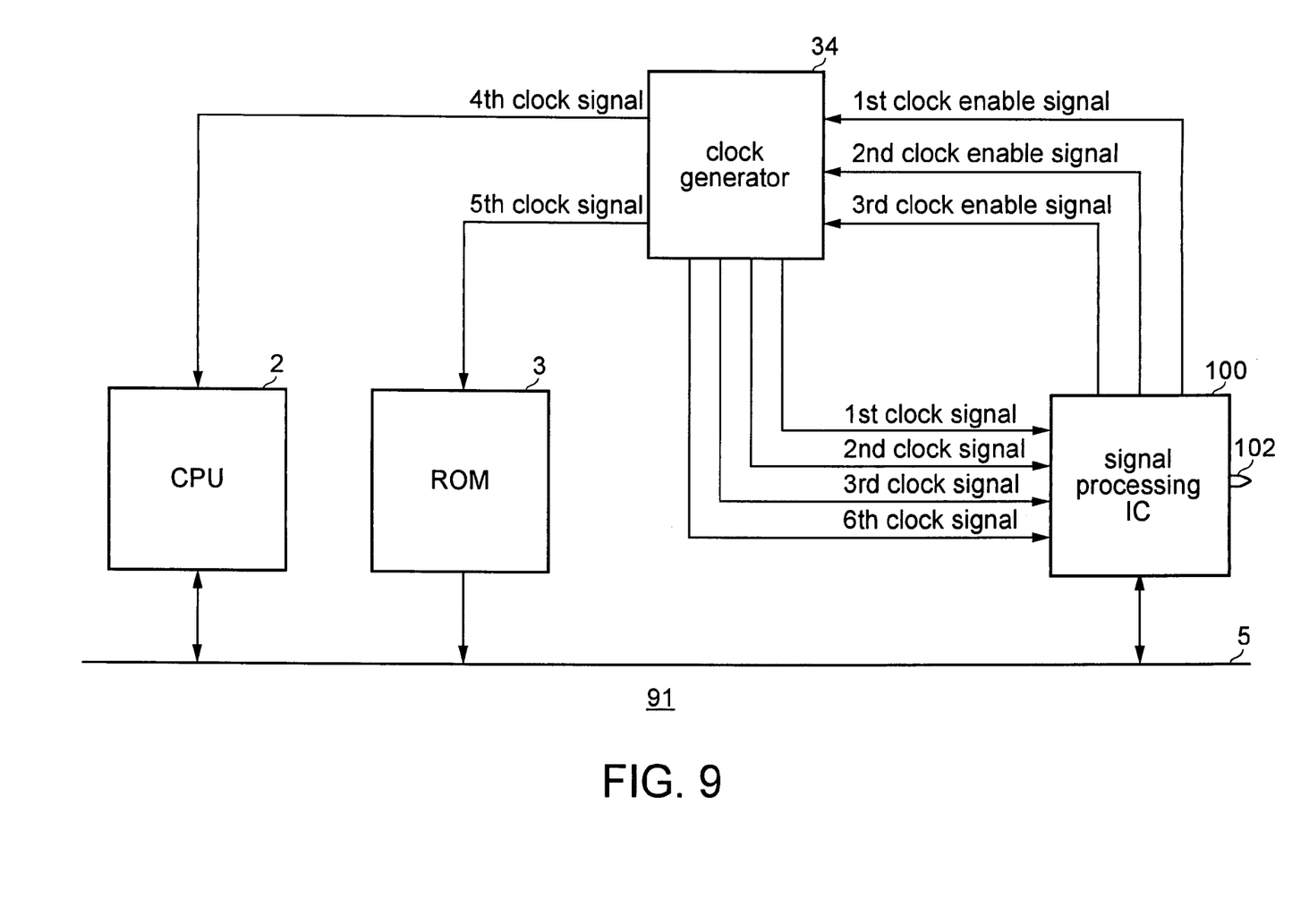
FIG. 9 shows a system according to a fifth embodiment of the present invention.

A fifth embodiment of the present invention is next described below. FIG. 9 schematically shows a system using a signal processing IC according to a fifth embodiment of the present invention. As shown in FIG. 9, a system 91 comprises: the CPU 2, the ROM 3, the clock generator 34, and a signal processing IC 100 according to the fifth embodiment of the present invention. The CPU 2, the ROM 3, and the signal processing IC 100 are connected through the bus 5.

Figure 10:
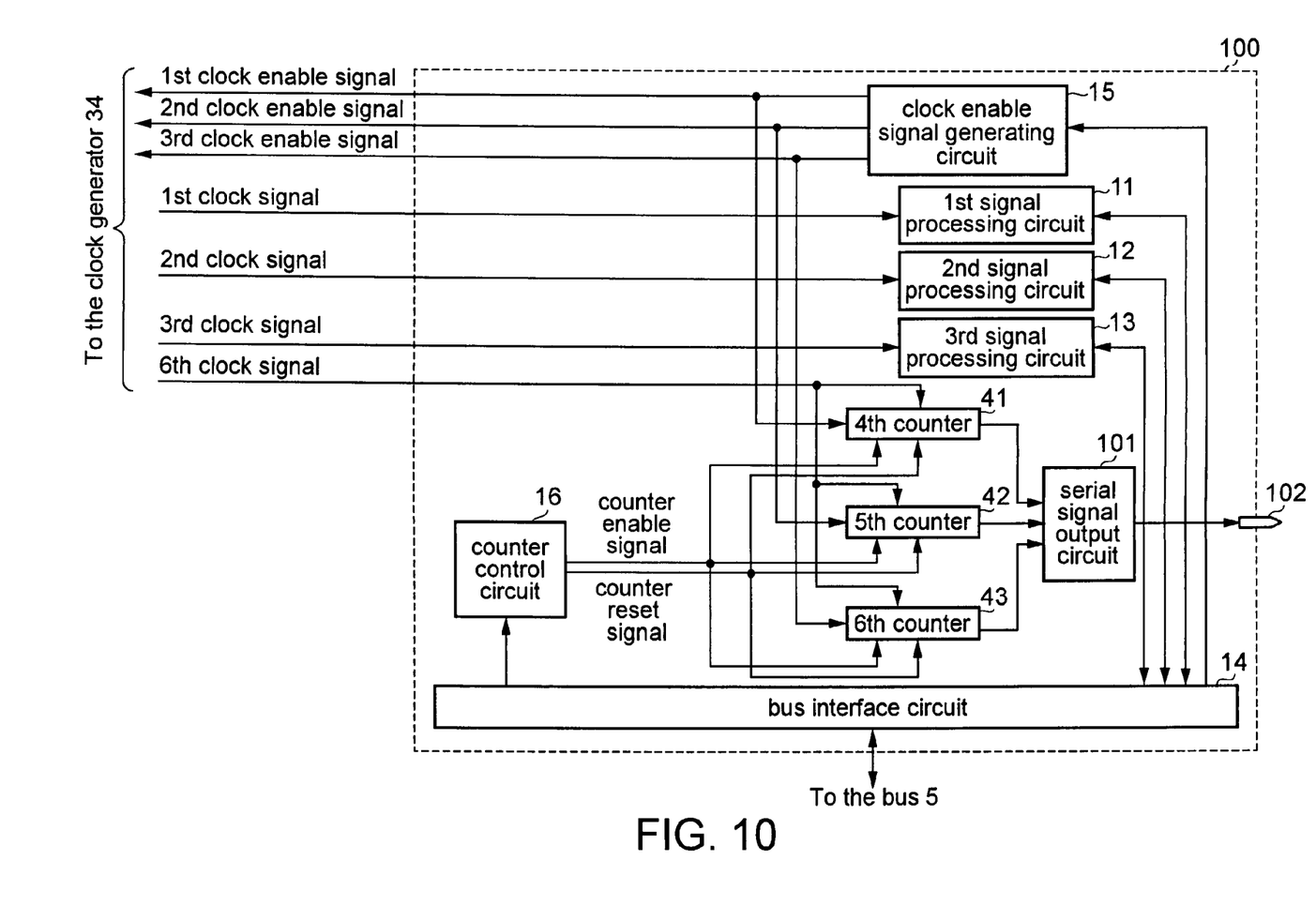
FIG. 10 shows a structure of a signal processing IC according to the fifth embodiment of the present invention.

FIG. 10 shows a general outline of an internal structure of the signal processing IC 100. As shown in FIG. 10, the signal processing IC 100 comprises: the first through third signal processing circuits 11 through 13 (functional blocks), the bus interface circuit 14, the clock enable signal generating circuit 15, the counter control circuit 16, the fourth through sixth counters 41 through 43, a serial signal output circuit 101, and a terminal 102.

The serial signal output circuit 101 converts the count values of the fourth through sixth counters 41 through 43 into a serial signal and output it via the terminal 102, to external.

In the case of the signal processing IC 100; a measuring device, such as a logic analyzer or other equivalent, receives the signal output from the terminal 102. Then, a PC or other equivalent can calculate each power consumption of the first through third signal processing circuits 11 through 13 by implementing calculation of the formulas of (7), (9), and (11).

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A semiconductor integrated circuit, comprising:
   a plurality of functional blocks materializing each of a plurality of specified functions, the plurality of functional blocks each operating according to a plurality of clock signals;
   a first control circuit generating a first group of control signals, each control signal controlling a supply of the plurality of clock signals to the plurality of functional blocks;
   a plurality of counter circuits counting another clock signal while the first group of control signals are each in an active state;
   an interface circuit externally outputting a plurality of count values that the plurality of counter circuits have each counted; and
   a second control circuit supplying a second group of control signals to each of the plurality of counter circuits for a specified time for operating the plurality of counter circuits, and generating an interrupt signal for commanding an external CPU to read the plurality of count values after the specified time elapses.

2. A semiconductor integrated circuit comprising:
   a plurality of functional blocks materializing each of a plurality of specified functions, the plurality of functional blocks each operating according to a plurality of clock signals;
   a first control circuit generating a plurality of control signals, each control signal controlling a supply of the plurality of clock signals to the plurality of functional blocks;
   a plurality of counter circuits counting another clock signal while the plurality of control signals are each in an active state;
   a second control circuit supplying the other clock signal to the plurality of counter circuits according to another control signal supplied from an external source; and
   an interface circuit externally outputting a plurality of count values that the plurality of counter circuits have each counted;
   wherein a frequency of the other clock signal is lower than a frequency of the plurality of clock signals.

3. A semiconductor integrated circuit comprising:
   a plurality of functional blocks materializing each of a plurality of specified functions, the plurality of functional blocks each operating according to a plurality of clock signals;
   a plurality of counter circuits each counting the plurality of clock signals;
   an interface circuit externally outputting a plurality of count values that the plurality of counter circuits have each counted;
   a conversion circuit converting the plurality of count values counted by the counter circuits into a serial signal and outputting the serial signal; and
   a terminal externally outputting the serial signal output by the conversion circuit.

* * * * *